United States Patent
Berke

(10) Patent No.: US 9,880,754 B2
(45) Date of Patent: Jan. 30, 2018

(54) SYSTEM AND METHOD FOR ENABLING TRANSPORTABILITY OF A NON VOLATILE DUAL INLINE MEMORY MODULE

(71) Applicant: Dell Products, LP, Round Rock, TX (US)

(72) Inventor: Stuart Allen Berke, Austin, TX (US)

(73) Assignee: DELL PRODUCTS, LP, Round Rock, TX (US)

( * ) Notice: Subject to any disclaimer, the term of this patent is extended or adjusted under 35 U.S.C. 154(b) by 288 days.

(21) Appl. No.: 14/326,987

(22) Filed: Jul. 9, 2014

(65) Prior Publication Data

US 2016/0011802 A1   Jan. 14, 2016

(51) Int. Cl.
*G06F 12/00* (2006.01)
*G06F 13/00* (2006.01)
*G06F 13/28* (2006.01)
*G06F 3/06* (2006.01)
G06F 12/02 (2006.01)
G11C 14/00 (2006.01)

(52) U.S. Cl.
CPC .......... *G06F 3/0619* (2013.01); *G06F 3/0632* (2013.01); *G06F 3/0679* (2013.01); *G06F 12/00* (2013.01); *G06F 3/0631* (2013.01); *G06F 12/0238* (2013.01); *G11C 14/0018* (2013.01)

(58) Field of Classification Search
CPC ..... G11C 29/00–29/04; G11C 14/0018; G06F 3/0619; G06F 3/0631; G06F 3/0632; G06F 3/0679; G06F 12/00; G06F 12/0238

USPC ........................ 711/166, 103, 104, 105, 115; 714/718–723
See application file for complete search history.

(56) References Cited

U.S. PATENT DOCUMENTS

| | | | |
|---|---|---|---|
| 8,341,433 B2 | 12/2012 | Artman et al. | |
| 2007/0220228 A1* | 9/2007 | Huang | G11C 7/1045 711/170 |
| 2009/0049270 A1* | 2/2009 | Khatri | G06F 11/1666 711/203 |
| 2010/0205348 A1* | 8/2010 | Moshayedi | G11C 5/14 711/102 |
| 2011/0138091 A1* | 6/2011 | Housty | G06F 9/4401 710/113 |
| 2012/0131253 A1 | 5/2012 | McKnight et al. | |
| 2012/0137168 A1* | 5/2012 | Lu | G06F 11/1482 714/6.13 |

(Continued)

OTHER PUBLICATIONS

U.S. Appl. No. 14/230,911, filed Mar. 31, 2014.
U.S. Appl. No. 13/723,695, filed Dec. 21, 2012.

*Primary Examiner* — Mark Giardino, Jr.
*Assistant Examiner* — Shane Woolwine
(74) *Attorney, Agent, or Firm* — Larson Newman, LLP

(57) ABSTRACT

A dual inline memory module includes a local memory and a non-volatile memory. The local memory stores data during normal operation of the dual inline memory module. The non-volatile memory includes a first portion and a second portion. The first portion stores the data located in the local memory in response to a power failure of an information handling system in communication with the dual inline memory module. The second portion stores configuration information for the dual inline memory module. The configuration information is utilized to set up the dual inline memory module in a new information handling system.

19 Claims, 5 Drawing Sheets

(56) References Cited

U.S. PATENT DOCUMENTS

| | | |
|---|---|---|
| 2012/0260137 A1* | 10/2012 | Berke ................. G06F 13/1673 |
| | | 714/721 |
| 2013/0060996 A1 | 3/2013 | Berke |
| 2013/0103887 A1 | 4/2013 | Frey et al. |
| 2013/0111308 A1 | 5/2013 | Sauber et al. |
| 2013/0166836 A1 | 6/2013 | Berke |
| 2013/0254474 A1 | 9/2013 | Berke et al. |
| 2016/0077979 A1* | 3/2016 | Lesartre ................. A61B 17/72 |
| | | 711/164 |

* cited by examiner

SYSTEM AND METHOD FOR ENABLING TRANSPORTABILITY OF A NON VOLATILE DUAL INLINE MEMORY MODULE

FIELD OF THE DISCLOSURE

The present disclosure generally relates to enabling transportability of a non-volatile dual inline memory module.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems. Information handling systems can also implement various virtualized architectures. Data and voice communications among information handling systems may be via networks that are wired, wireless, or some combination.

An information handling system can include a non-volatile dual inline memory module (NVDIMM) that can preserve data indefinitely after a system input power failure. After the power is restored to the information handling system, data can be retrieved from the NVDIMM by the information handling system.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings.

Figure 1:
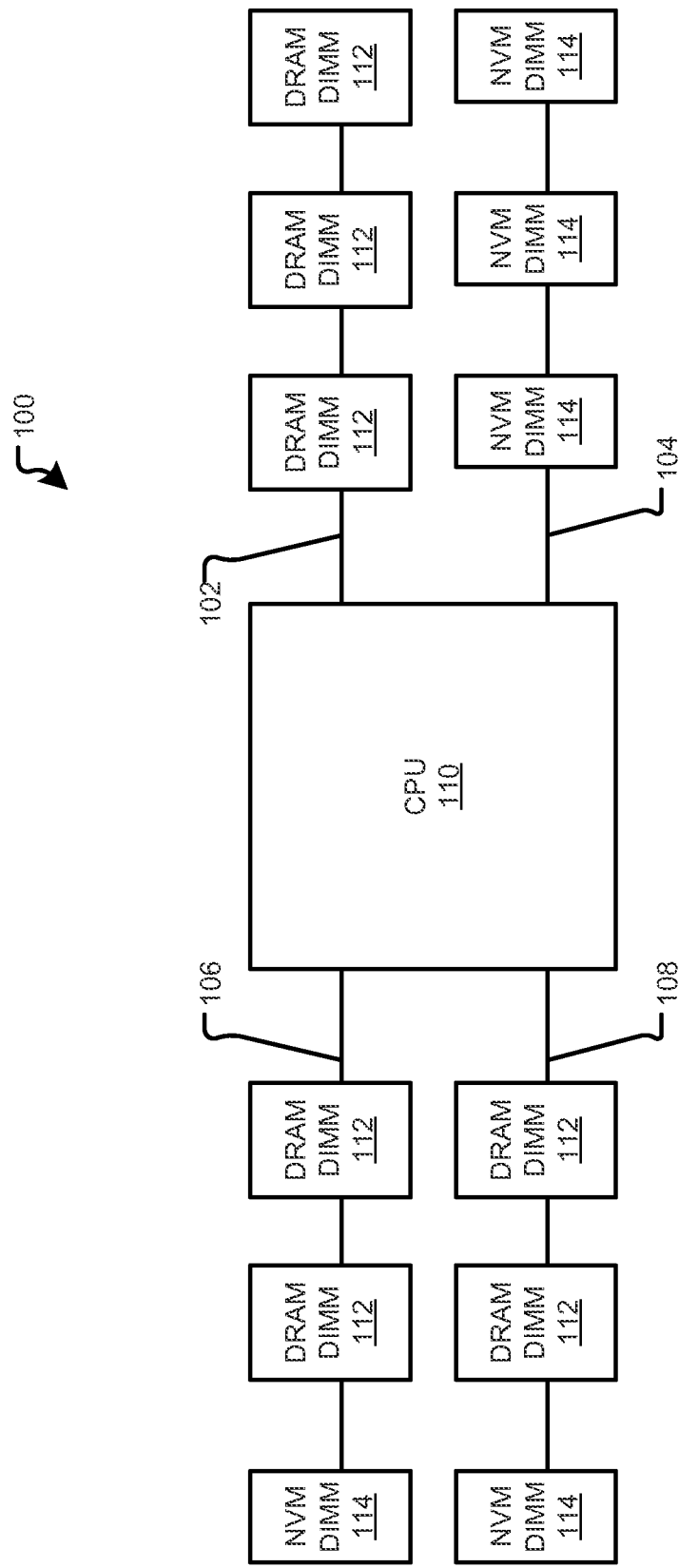
FIG. 1 is a block diagram of an information handling system including a processor with four memory channels and twelve dual inline memory module (DIMM) slots.

FIG. 1 shows an information handling system 100. For purposes of this disclosure, an information handling system can include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e,g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

FIG. 1 shows the information handling system 100 including four double date rate (DDR) channels 102, 104, 106, and 108, and with three DDR slots per each channel. As shown, the information handling system 100 may include a combination of standard volatile dynamic random access memory (DRAM)-based dual inline memory modules (DIMMs) 112 and non-volatile memory (NVM)-based DIMMs 114, although it is also possible that a combination of volatile static SRAM DIMMs and NVM DIMMs may also be employed. In an embodiment, the DIMM types, such as DRAM DIMMs 112 and NVM DIMMs, may be segregated by DDR channel. For example, DDR channel 102 only connects to DRAM DIMMs 112, and DDR channel 104 only connects to NVM DIMMs 114. In an embodiment, the DIMM types may also be mixed on the same DDR channel. For example, DDR channels 106 and 108 connect to both DRAM DIMMs 112 and NVM DIMMs 114. When NVM DIMMs 114 and DRAM DIMMs 112 are mixed on a DDR channel, a system host memory controller, such as an integrated memory controller or a non-integrated memory controller, may be programmed to handle the latency differences and turnaround times appropriately.

Figure 2:
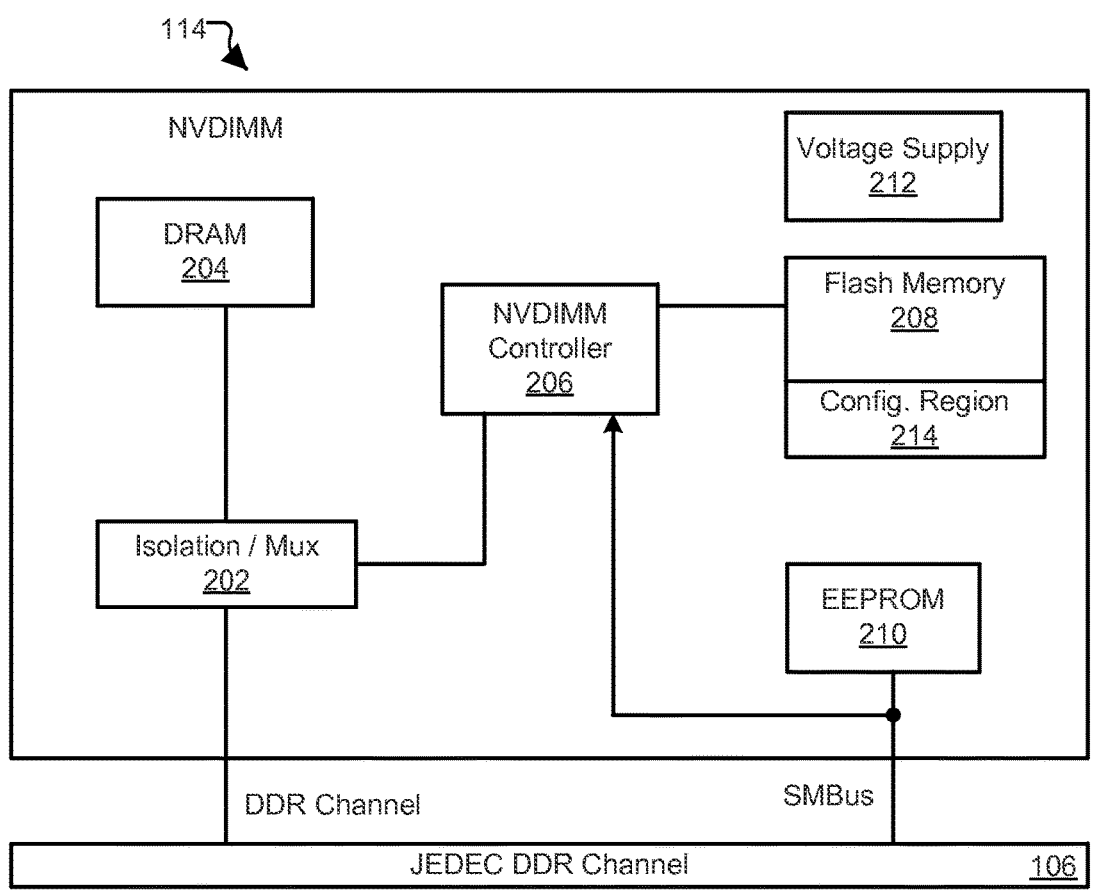
FIG. 2 is a block diagram of a non-volatile dual inline memory module (NVDIMM)

FIG. 2 shows a DRAM-based non-volatile dual inline memory module (NVDIMM) 114 including an isolation multiplexor 202, a DRAM 204, a NVDIMM controller or control module 206, a flash memory 208 and an electronically erasable programmable read-only memory (EEPROM) 210, and a voltage supply 212. The flash memory 208 can be partitioned into multiple memory regions or portions, such as a first region to store data and restore information, and a second region or configuration region 214. Taking advantage of the higher speed of the DRAM 204 versus inherently non-volatile memory flash memory 208, the information handling system 100 can operate using DRAM during normal operations while providing persistence, via the flash memory, in the event of unexpected system input power failure. The persistence protects at least a portion of the otherwise volatile memory of DRAM 204. In other embodiments, DRAM 204, isolation multiplexor 202, NVDIMM controller 206, flash memory 208, and configuration region 214 may each be implemented as a plurality of physical devices. In other embodiments, flash memory 208 and configuration region 214 may be implemented in any other suitable non-volatile memory (NVM) type other than Flash.

In an embodiment, the voltage supply 212 can be supercapacitor or ultra-capacitor assembly or battery that can provide power to the NVDIMM 114 throughout a SAVE operation performed in response to a system input power failure. In some applications, batteries are not acceptable in place of capacitors due to safety concerns, recycling concerns, limitations on recharge cycles, service training implications, and other reasons.

During power-on self test (POST), assuming there is not a valid set of data to RESTORE in the NVDIMM 114, per system, and per DIMM configuration information is stored within each populated NVDIMM 112 in the information handling system 100. In an embodiment, the configuration information is stored in the flash memory 208 of the NVDIMM 114, in a private area reserved for the configuration information. For example, the configuration information can be stored in the configuration region 214 of the flash memory 208 different embodiments, the size of the configuration region 214 can be as few as dozens to hundreds of bytes, to a few kilobytes. In an embodiment, the configuration information is provided to the configuration region 214 via a data transfer on the system management bus (SMBus), via an inter-integrated circuit (I2C) transfer, or the like. The NVDIMM does not use the configuration region 214 for data writes or reads during SAVE/RESTORE operations. However, the remainder of the flash memory 208 can be utilized to store or retrieve data during SAVE/RESTORE operations. In an embodiment, the data for SAVE/RESTORE operation stored in the flash memory 208 can be encrypted, but the configuration information stored in the configuration region 214 is preferably not encrypted.

In another embodiment, the configuration information can be stored in the DIMM serial presence detect (SPD) original equipment manufacturer (OEM) area 210. For example, Double Data Rate 4 (DDR4) SPD allows 128 bytes for OEM use. In an embodiment, all 128 bytes may be used for storing the configuration information. In another embodiment, 32 bytes can be utilized for DIMM error logging and the remaining 96 bytes can be available for storing the configuration information. In another embodiment, the configuration information associated specifically with the NVDIMM 114 can be stored in the configuration region 214, and the configuration information for the entire information handling system 100 can be stored split across all of the populated NVDIMMs 114 within the information handling system. For example, if 64 SPD bytes are available per DIMM, 32 bytes may be used for per DIMM parameters, and 32 bytes may be used for per system parameters. In this situation, if the information handling system 100 has 8 NVDIMMs 114, the information handling system would be able to store 8 * 32 =256 bytes worth of system configuration information. The configuration information can be utilized if the NVDIMM 114 is transferred from one information handling system to another. The configuration information will be discussed with respect to tables 1-5 below. Each of the tables includes a parameter column, a number of bytes column, a required for in-system validation column, a required for transportability validation column, and a comments column. Table 1 shows configuration information parameter associated with slot population for the NVDIMM 114. These parameters are written to configuration region 214 during POST if a valid RESTORE configuration and status is not detected. The DIMM slot identification (ID) reflects the physical or logical location of the NVDIMM 114 in the information handling system 100, such as the physical or logical CPU, DDR channel, and DIMM location. For example NVDIMM 114 can have a DIMM slot ID of (1, 4, 3). In this example, it is assumed that CPU 102 of FIG. 1 is the first CPU in the information handling system 100, that the DDR channel 108 is the fourth DDR channel for CPU 102, and that the slot location of NVDIMM 114 is slot three. The DIMM slot ID can be checked on subsequent power-ons. A basic input/output system (BIOS), such as BIOS 540 of FIG. 5, or system management maintains a platform specific enumeration for the DIMM slot ID which uniquely covers CPU, channel, slot, and the like. The NVDIMM set sequence number parameter allows the information handling system 100 to write a unique sequence number and number of NVDIMMs number to ensure that all of the NVDIMMs are present during a subsequent power-on. For example, the NVDIMM set sequence number for the NVDIMM 114 can be DIMM 12 of 12. The system model number parameter can used to ensure that the NVDIMM 114 is located in the same or compatible system for a RESTORE operation to occur. Similarly, the system ID parameter is used to determine if the NVDIMM 114 has been transported to a new information handling system. As shown in Table 1 below, all of these parameters are needed when the NVDIMM is powered on. In an embodiment, the DIMM slot ID, and NVDIMM sequence number utilize less than 1 byte of the configuration region 214, while the system model number and system ID utilize between 1 and 8 bytes.

TABLE 1

NVDIMM Slot Population and Set Consistency Validation

| Parameter | Number of bytes | Required for in-system validation? | Required for Transportability to new System? | Comment |
| --- | --- | --- | --- | --- |
| DIMM Slot ID (CPU#, Channel#, DIMM#) | <1 | Yes | Yes | Validate NVDIMM is populated in correct DIMM slot |
| NVDIMM Set Sequence Number, "N" of "M" | <1 | Yes | Yes | Validate all NVDIMM within a set are present |
| System Model Number | ~1-8 | Yes | Yes | Validate compatible system type for RESTORE |
| System ID | ~1-8 | Optional | Optional | Validate all NVDIMMs came from same system for RESTORE |

Table 2 includes parameters associated with different memory RAS modes, such as error correction code (ECC) mode, sparing mode, lockstep mode, mirror mode, or the like. These parameters are preferably written to the configuration region 214 during POST if a valid RESTORE configuration and status is not detected. These RAS modes may alter the physical addressing of the DRAM 204 and within NVDIMM 114, such that these parameters must be validated to be consistent with the RAS mode settings on the system before a RESTORE can be attempted. In an embodiment, the RESTORE operation can be transferring data from the flash memory 208 to the DRAM 204.

Figure 5:
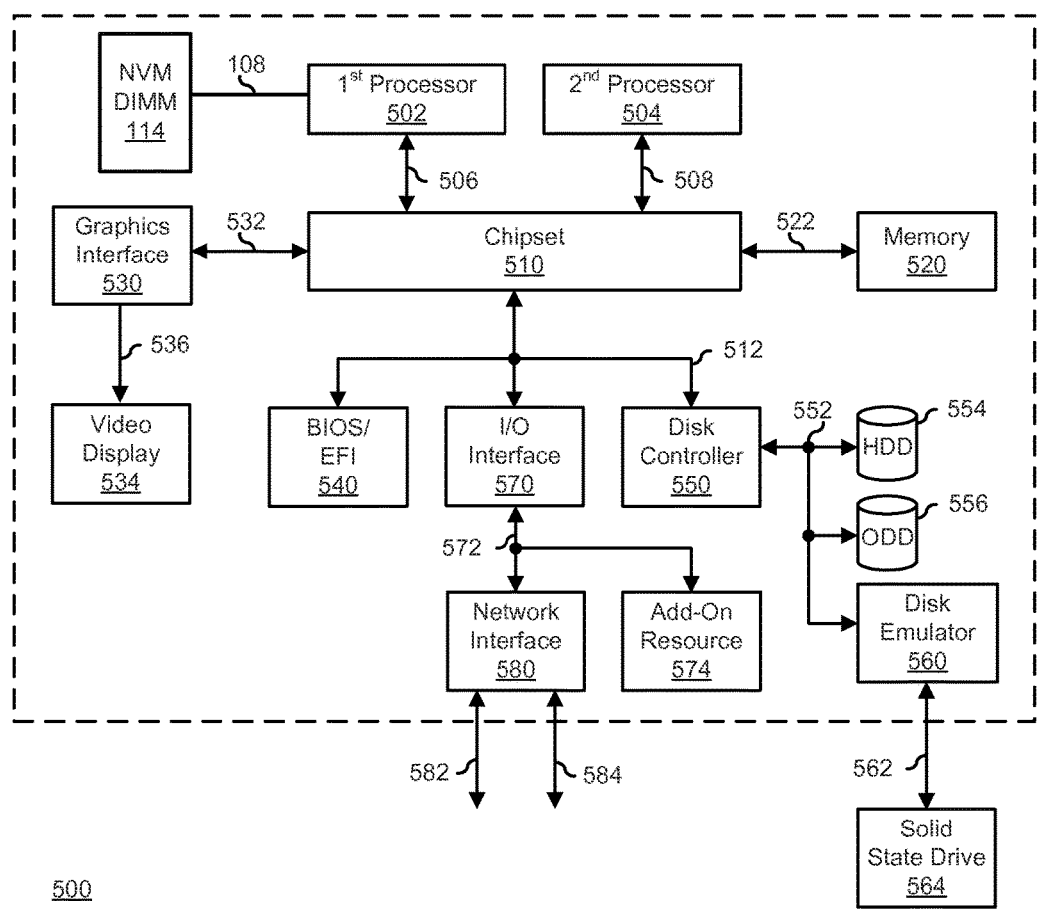
FIG. 5 is a block diagram illustrating a general information handling system according to an embodiment of the present disclosure.

In an embodiment, a BIOS, such as BIOS 540 of FIG. 5, may check the reliability availability and serviceability (RAS) modes for NVDIMM 114 against the information handling system and control module 206 configuration to ensure that these parameters are consistent, and if not, prompt the user or serviceperson to update the BIOS memory RAS mode settings and restart. In an embodiment, this prompt can be provided via a display, such as display 534 of FIG. 5. In another embodiment, the BIOS may be configured to automatically make updates to the RAS modes of the system when it determines the modes are inconsistent. In an embodiment, as shown in Table 2 below, the memory interleave mode parameter, the memory lockstep mode parameter, and the memory ECC mode parameter each utilize less than 1 byte within the configuration region 214. While the memory sparing mode parameter utilizes approximately 1 byte, and the memory mirror mode parameter utilizes between 1-8 bytes of the configuration region 214.

TABLE 2

Main Memory RAS Mode

| Parameter | Number of Bytes | Required for In-System Validation? | Required for Transporability to new System? | Comment |
| --- | --- | --- | --- | --- |
| Memory Interleave Mode (CPU, DIMM, Rank, Bank, etc.) | <1 | Yes | Yes | Ensure Memory Interleave is set correctly for RESTORE |
| Memory Lockstep Mode (Channel Pairing) | <1 | Yes | Yes | Ensure Memory Lockstep is set correctly for RESTORE |
| Memory ECC Mode (ECC, SDDC, DDDC, etc.) | <1 | Yes | Yes | Ensure Memory ECC is set correctly for RESTORE |
| Memory Sparing Mode (DIMM, Rank, Bank, etc.) | ~1 | Yes | Yes | Ensure Memory Sparing is set correctly for RESTORE |
| Memory Mirror Mode (Full, Partial, Address Range, etc.) | ~1-8 | Yes | Yes | Ensure Memory Mirroring is set correctly for RESTORE |

Configuration information parameters associated with error preservation state in the NVDIMM 114 can be written to the configuration region 214 during POST, and updated as necessary during normal operation of the NVDIMM. The error preservation parameters are utilized to reflect the current state of any failed ranks, banks, DRAMs, addresses, or the like within the NVDIMM 114. These that have been marked by the system as not usable. Since these elements have been mapped out due to memory errors, the same mapping out must be reflected onto the new system before a RESTORE can be attempted.

In an embodiment, a BIOS, such as BIOS 540 of FIG. 5, may check the error preservation status for the NVDIMM 114 read from the configuration region 214 and update the BIOS, memory controller, ACPI tables, and other functions that need to track the health state of the memories within the information handling system 100. As shown in Table 3 below, each of these parameters are required when the NVDIMM 114 is powered on not only in the same information handling system 100 as the data is originally recorded, but also when the NVDIMM is transported to new information handling system, such as after a power failure in the original information handling system. In an embodiment, as shown in Table 3, the number of bytes for these parameters are as follows: 1-2 bytes for failed ranks; 2-16 bytes for failed banks; and 2-3 bytes for failed DRAMs.

TABLE 3

Per NVDIMM Error Preservation

| Parameter | Number of Bytes | Required for In-System Validation? | Required for Transportability to new System? | Comment |
| --- | --- | --- | --- | --- |
| Failed Ranks | 1-2 | Yes | Yes | Bitmap of Ranks that have been mapped out due to errors |
| Failed Banks | 2-16 | Yes | Yes | Bitmap of Banks that have been mapped out due to errors |
| Failed DRAMs | 2-3 | Yes | Yes | Bitmap of DRAMs that have been mapped out due to errors |
| Failed Addresses | N | Yes | Yes | Bitmap of Addresses that have been mapped out due to errors |

During POST, parameters associated with the DRAM 204 can be written to the configuration region 214. These parameters can be associated with registers in the DRAM 204 and can be training values required for operation of the DRAM and controller module 206. In an embodiment, the training values can include communication speed and timing for the DRAM 204 and the control module 206 to communicate with the information handling system 100 via the DDR channel 106. As shown in Table 4, the DRAM parameters should be reflected in the new information handling system before a RESTORE can be attempted. In another embodiment, the training values need not be provided to the new information handling system. In this situation, the new information handling system can perform training for the DRAM 204 and control module 206 to determine the training values without receiving the values from the configuration region 214. In an embodiment, during POST the BIOS, such as BIOS 540 in FIG. 5, may read these parameters from the configuration region 214, and restore the values for NVDIMM 114.

TABLE 4

Per NVDIMM Parameters

| Parameter | Number of Bytes | Required for In-System Validation? | Required for Transportability to new System? | Comment |
| --- | --- | --- | --- | --- |
| DRAM MSRs | 8+ | Yes | Yes | Restore DRAM in new system |

TABLE 4-continued

Per NVDIMM Parameters

| Parameter | Number of Bytes | Required for In-System Validation? | Required for Transportability to new System? | Comment |
|---|---|---|---|---|
| DRAM Training Values | 8+ | Yes | Optional | Restrain in new system |
| NVDIMM Register CSRs | 8+ | Yes | Yes | Restore DRAM in new system |

Table 5 below includes parameters for the entire information handling system 100, such as a BIOS revision, and an encryption key for data stored in the flash memory 208. These parameters can be written to configuration region 214 during POST, and updated as necessary during normal operation. The BIOS revision parameter can notify the new information handling system of the BIOS revision level needed in the new information handling system so that a RESTORE can be performed in the NVDIMM 114 on new information handling system. The encryption keys or hashes can be provided to the enable the new information handling system unlock the data stored in the flash memory 208.

TABLE 5

Per System Parameters

| Parameter | Number of Bytes | Required for In-System Validation? | Required for Transportability to new System? | Comment |
|---|---|---|---|---|
| BIOS Revision | 1-2 | Yes | Yes | Ensure BIOS level is ok for RESTORE |
| Encryption Key | TBD | No | Yes | Needed for Data Restore |

The configuration in Tables 1-5 above can be utilized by an information handling system when a POST is performed for the NVDIMM 114 to ensure proper communication and consistent configuration between the information handling systems and the NVDIMM. In an embodiment, parameters listed as Yes under the column labeled "Required for In-System Validation?" may be used to consistency check the NVDIMMs 114 within an information handling system during POST when the NVDIMMs reside in the system in which they have been previously configured and operated. For example, if four NVDIMMs 114 had been configured and operated in information handling system 100, and then during a subsequent system re-boot one of the four NVDIMMs fails to respond, the parameters in Table 5 above may be used to detect that the overall state of the discovered NVDIMMs is not consistent and a service person could be alerted or an error log could be written. In another example, if one of the four DIMMs has inconsistent settings for memory RAS mode, system ID, or the like, remedial actions could be initiated.

In an embodiment, the parameters listed as Yes under the column labeled "Required for Transportability to a new System?" may be used to consistency check the NVDIMMs 114 within a new information handling system during POST when the NVIMMs have been transported to a new system. In other embodiments, different or additional parameters may be used for consistency checking for In-System Validation or Transportability to a new system.

During normal operation of the NVDIMM 204, data is written to and read from the DRAM 204 via the DDR channel and the isolation multiplexor 202. When an input power failure is detected for the entire information handling system 100, voltage supply 212 of the NVDIMM 114 can provide power to each of components in the NVDIMM, so that the data stored in DRAM 204 can be copied to the flash memory 208. The isolation multiplexor 202 can isolate the DRAM 204 from the DDR channel 106, because the commands and data on the DDR channel may become unreliable, and to ensure that the system does not affect the copy process during the STORE operation after the power failure. Once power is restored in the information handling system 100, the BIOS of the information handling system can verify the configuration information in the configuration region 214 as described above, and then the control module 206 can copy data in the remaining portion of the flash memory 208 to the DRAM 204.

However, if the power is not restored to the information handling system 100, the NVDIMM 114 can be plugged into a new information handling system, and the new information handling system can retrieve the configuration information from the configuration region 214 via the SMBus and the control module 206. The new information handling system can then use the configuration information to set up communication and configuration between the information handling system and the NVDIMM 114. For example, the BIOS of the new information handling system can utilize the training values found in the configuration information as a starting point to determining timing and communication speeds to utilize during reads and writes to the DRAM 204 via a DDR channel.

DDR training values are a function of the DIMMs, the system board, the CPU, and other in-situ characteristics. Titus, the training values preserved in the configuration region may not be optimal or may not work at all on a new information handling system, or even within the information handling system 100 if a CPU or other components are changed. In an embodiment, during POST, if a RESTORE is determined to be valid, the BIOS may program the memory controller interface and NVDIMM 114 into a relaxed timing mode called DRAM delay-lock loop (DLL) off mode, which operates at a fraction of normal operating speed, such as 10-20 times slower. In this mode, strobe, preamble, voltage reference and other training is unnecessary to safely perform reads and writes between the system and the NVDIMM 114. The new information handling system may copy the RESTORED DRAM contents off the DRAM 204 to a local memory new information handling system, then perform optimal training of the DDR interface, and then copy the contents back to the DRAM before booting the NVDIMM 114 to the operating system. After the training is completed the BIOS of the new information handling system can check the compatibility of the NVDIMM 114 to the new information handling system.

The BIOS can first utilize the system model number and potentially the system ID fields to ensure that the new information handling system is compatible with the last information handling system 100 in which the NVDIMM 114 was installed at the time of a SAVE operation. In an embodiment, the new system does not need to be identical to the last information handling system, but each information handling system can maintain a list of compatible information handling systems from which the NVDIMM 204 could be transported from. For example, it is possible to move the NVDIMM 114 into any target information handling system that includes a compatible processor family, compatible memory RAS mode and interleaving support, and minimum level or revision of BIOS support.

In an embodiment, the BIOS on the new system may contain DIMM topology mapping tables for each compatible system, such as physical DIMM slots/channel/positions, and be able to either consistency check that the population of DIMMs is correct for a RESTORE, or to provide guidance to a user or serviceperson to rearrange the NVDIMMs into a population that is possible for a RESTORE. The BIOS can utilize the DIM M slot ID and NVDIMM Set Sequence Number to verify that the DIMM is in its proper location in the information handling system, and that all of the NVDIMMs in the set of DIMMs are present in the information handling system. In an embodiment, 8 NVDIMMs can be first located in a 2U 2 Socket information handling system with one DIMM per channel, and then may be moved to 8 DIMMs on a 2 Socket server, or a half-height blade/sled 2 Socket server, or even a full height blade/sled 4 Socket server, each with different DIMM location mapping or nomenclature. In an embodiment, the guidance can be provided as a prompt display on the display 534 of FIG. 5.

The BIOS of the information handling system can then utilize the RAS parameters stored as configuration information in the configuration region 214, such as the Memory Interleave Mode, the Memory Lockstep Mode, Memory ECC Mode, Memory Sparing Mode, and Memory Mirror Mode, to ensure that the RAS parameters of the information handling system are set the same as the RAS parameters for the NVDIMM 114. The BIOS can also utilize the Error Preservation configuration information, as shown in Table 3 above, of the NVDIMM 114 to mapped out any failed ranks, banks, DRAMs, or addresses in the NVDIMM after power is restored to the NVDIMM in the new information handling system. After the training and compatibility checks are completed, the BIOS can utilize the encryption information in the configuration information to access the data in the flash memory 208 that is to be utilized for the RESTORE operation. After decrypting the data, the control module 206 can transfer the data from the flash memory 208 to the DRAM 204 during a RESTORE operation, and the NVDIMM can be used during normal operation by the new information handling system.

Figure 3:
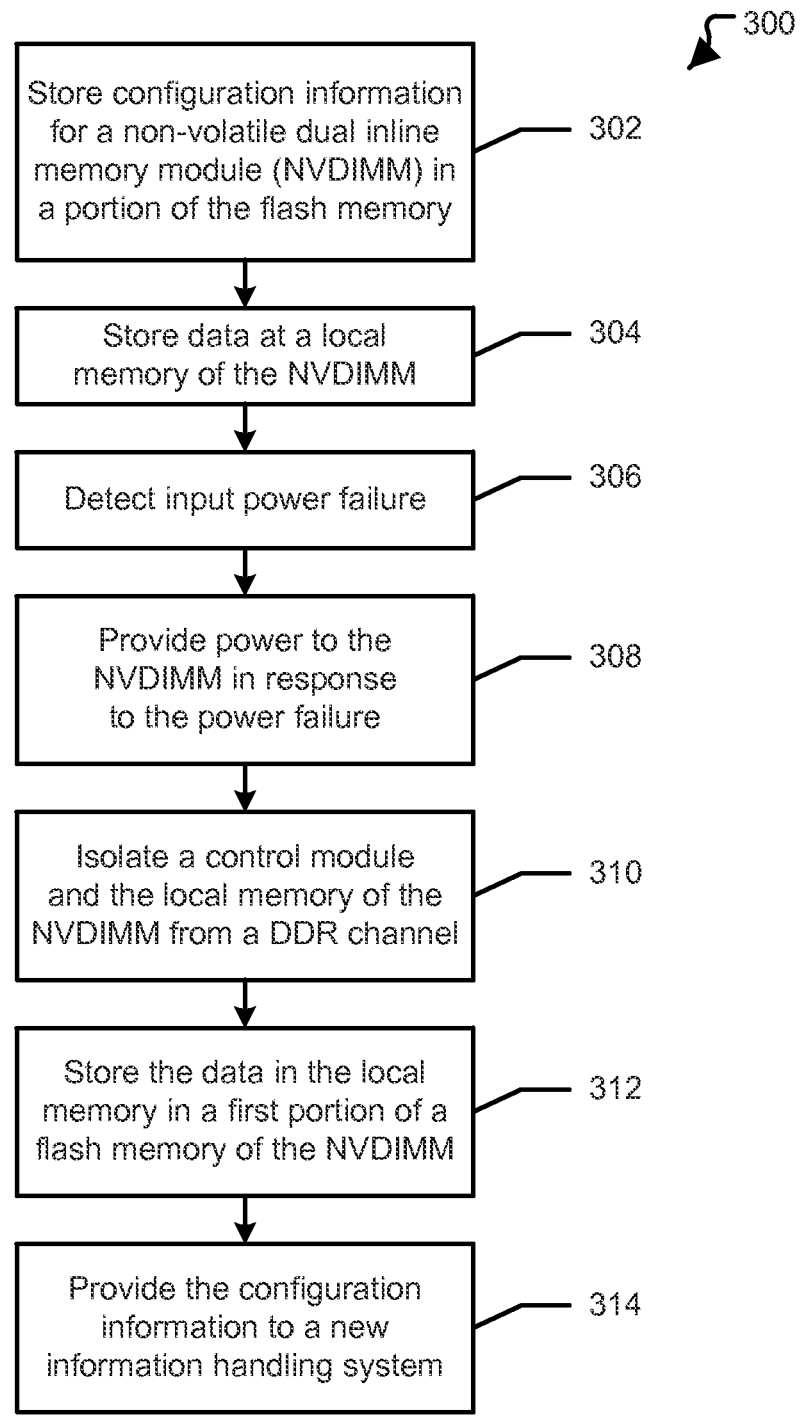
FIG. 3 is a flow diagram of a method for storing configuration information for a NVDIMM.

FIG. 3 shows a flow diagram of a method 300 for storing configuration information for a NVDIMM, such as NVDIMM 114 shown in FIG. 2. The flow starts at block 302 and configuration information for the NVDIMM is stored at a second portion of the flash memory. In an embodiment, the configuration information is utilized to set up the NVDIMM in a new information handling. In an embodiment, the configuration information includes a reliability availability and serviceability mode for the dual inline memory module, a slot identification for the dual inline memory module in the information handling system, and the like. At block 304, data is stored at a local memory of a. NVDIMM during normal operation of the NVDIMM within an information handling system. An input power failure for the information handling system is detected at block 306. At block 308, power is provided, by a power source of the NVDIMM, to the NVDIMM in response to the power failure. In an embodiment, wherein the power source is configured to provide the power to enable the data to be copied from the local memory to the flash memory.

At block 310, the local memory and the control module are isolated from a DDR channel of the information handling system in response to the power failure. In an embodiment, an isolation multiplexor of the NVDIMM isolates the control module and the local memory from the DDR channel. At block 312, the data located in the local memory is stored at a first portion of a flash memory of the NVDIMM in response to a power failure of the information handling system in communication with the NVDIMM. The configuration information is provided to the new information handling system via a system management bus prior to the dual inline memory module being powered on in the new information handling system at block 314.

Figure 4:
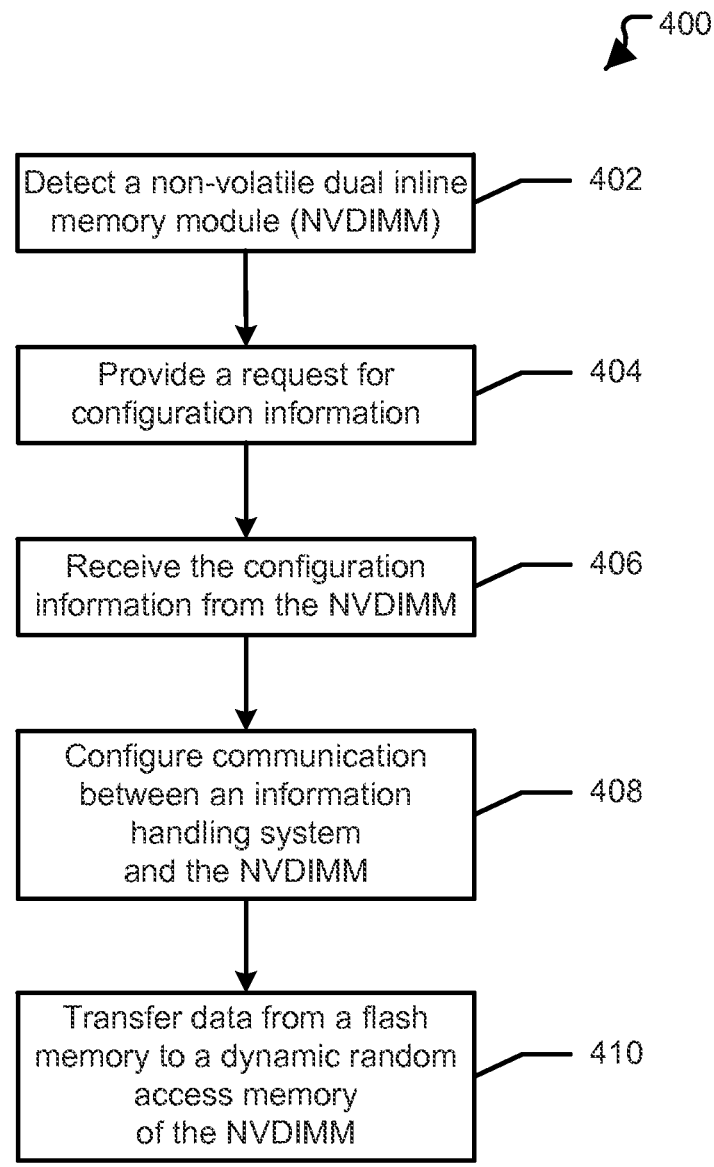
FIG. 4 is a flow diagram of a method for utilizing the configuration information in the NVDIMM to initiate communication between the information handling system and the NVDIMM.

FIG. 4 shows a flow diagram of a method for utilizing the configuration information in the NVDIMM to initiate communication between the information handling system and the NVDIMM. At block 402, a connection of a NVDIMM to an information handling system, such as information handling system 100 is detected. In an embodiment, the NVDIMM can be detected in response to the NVDIMM being plugged into a DIMM slot of the information handling system 100. In another embodiment, the NVDIMM can be detected during POST discovery of installed DIMMs via an SMBus. The method then proceeds to block 404 and a request for configuration information of the NVDIMM is provided to the NVDIMM via a system management bus. In an embodiment, the system management bus can he a low speed two pin bus that can enable communication between the NVDIMM and the information handling system prior to the NVDIMM being fully integrated into the information handling system. In an embodiment, the system management bus can be replaced with an inter-integrated circuit communication bus.

At block 406, the configuration information is received from the NVDIMM. In an embodiment, a control module of the NVDIMM can provide the configuration information to the information handling system, and the control module can retrieve the configuration information from a first portion of a flash memory of the NVDIMM. In an embodiment, the configuration information includes a reliability availability and serviceability mode for the dual inline memory module, a slot identification for the dual inline memory module in the information handling system, a basic input/output system revision compatible with the dual inline memory module, and the like. At block 408, communication between the information handling system and the NVDIMM over a dual data rate channel is configured based on the configuration information. At block 410, data is transferred from a second portion of the flash memory to a local memory of the NVDIMM in response to the communication being configured and the dual inline memory module being powered on. In an embodiment, the data is utilized to restore the dual inline memory module to a state prior to a power failure.

FIG. 5 illustrates a generalized embodiment of general information handling system 500, such as information handling system 100. For purpose of this disclosure information handling system 500 can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 500 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 500 can include processing resources for executing machine-executable code, such as a central processing unit (CPU), a programmable logic array (PLA), un embedded device such as a System-on-a-Chip (SoC), or other control logic hardware.

Information handling system 500 can also include one or more computer-readable medium for storing machine-executable code, such as software or data. Additional components of information handling system 500 can include one or more storage devices that can store machine-executable code, one or more communications ports for communicating with external devices, and various input and output (I/O) devices, such as a keyboard, a mouse, and a video display. Information handling system 500 can also include one or more buses operable to transmit information between the various hardware components.

Information handling system 500 can include devices or modules that embody one or more of the devices or modules described above, and operates to perform one or more of the methods described above. Information handling system 500 includes a processors 502 and 504, a chipset 510, a memory 520, a graphics interface 530, include a basic input and output system/extensible firmware interface (BIOS/EFI) module 540, a disk controller 550, a disk emulator 560, an input/output (I/O) interface 570, and a network interface 580. Processor 502 is connected to chipset 510 via processor interface 506, and processor 504 is connected to the chipset via processor interface 508. Processor 502 is also connected to NVDIMM 114 via the DDR channel 108 as described above. Memory 520 is connected to chipset 510 via a memory bus 522. Graphics interface 530 is connected to chipset 510 via a graphics interface 532, and provides a video display output 536 to a video display 534. In a particular embodiment, information handling system 500 includes separate memories that are dedicated to each of processors 502 and 504 via separate memory interfaces. An example of memory 520 includes random access memory (RAM) such as static RAM (SRAM), dynamic RAM (DRAM), non-volatile RAM (NV-RAM), or the like, read only memory (ROM), another type of memory, or a combination thereof.

BIOS/EFI module 540, disk controller 550, and I/O interface 570 are connected to chipset 510 via an I/O channel 512. An example of I/O channel 512 includes a Peripheral Component Interconnect (PCI) interface, a PC i-Extended (PCI-X) interface, a high-speed PCI-Express (PCIe) interface, another industry standard or proprietary communication interface, or a combination thereof. Chipset 510 can also include one or more other I/O interfaces, including an Industry Standard Architecture (ISA) interface, a Small Computer Serial Interface (SCSI) interface, an Inter-Integrated Circuit (I²C) interface, a System Packet Interface (SPI), a Universal Serial Bus (USB), another interface, or a combination thereof. BIOS/EFI module 540 includes BIOS/EFI code operable to detect resources within information handling system 500, to provide drivers for the resources, initialize the resources, and access the resources. BIOS/EFI module 540 includes code that operates to detect resources within information handling system 500, to provide drivers for the resources, to initialize the resources, and to access the resources.

Disk controller 550 includes a disk interface 552 that connects the disc controller o a hard disk drive (HDD) 554, to an optical disk drive (ODD) 556, and to disk emulator 560. An example of disk interface 552 includes an Integrated Drive Electronics (IDE) interface, an Advanced Technology Attachment (ATA) such as a parallel ATA (PATA) interface or a serial ATA (sATA) interface, a SCSI interface, a USB interface, a proprietary interface, or a combination thereof. Disk emulator 560 permits a solid-state drive 564 to be connected to information handling system 500 via an external interface 562. An example of external interface 562 includes a USB interface, an IEEE 1394 (Firewire) interface, a proprietary interface, or a combination thereof. Alternatively, solid-state drive 564 can be disposed within information handling system 500.

I/O interface 570 includes a peripheral interface 572 that connects the I/O interface to an add-on resource 574 and to network interface 580. Peripheral interface 572 can be the same type of interface as I/O channel 512, or can be a different type of interface. As such, I/O interface 570 extends the capacity of I/O channel 512 when peripheral interface 572 and the I/O channel are of the same type, and the I/O interface translates information from a format suitable to the I/O channel to a format suitable to the peripheral channel 572 when they are of a different type. Add-on resource 574 can include a data storage system, an additional graphics interface, a network interface card (NIC), sound/video processing card, another add-on resource, or a combination thereof. Add-on resource 574 can be on a main circuit board, on separate circuit board or add-in card disposed within information handling system 500, a device that is external to the information handling system, or a combination thereof.

Network interface 580 represents a NIC disposed within information handling system 500, on a main circuit board of the information handling system, integrated onto another component such as chipset 510, in another suitable location, or a combination thereof. Network interface device 580 includes network channels 582 and 584 that provide interfaces to devices that are external to information handling system 500. In a particular embodiment, network channels 582 and 584 are of a different type than peripheral channel 572 and network interface 580 translates information from a format suitable to the peripheral channel to a format suitable to external devices. An example of network channels 582 and 584 includes InfiniBand channels, Fibre Channel channels, Gigabit Ethernet channels, proprietary channel architectures, or a combination thereof. Network channels 582 and 584 can be connected to external network resources (not illustrated). The network resource can include another information handling system, a data storage system, another network, a grid management system, another suitable resource, or a combination thereof.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method comprising:
storing, at a local memory of a dual inline memory module, data during normal operation of the dual inline memory module within an information handling system;
storing, at a first portion of a non-volatile memory of the dual inline memory module, the data located in the local memory in response to a power failure of the information handling system in communication with the dual inline memory module;
storing, at a second portion of the non-volatile memory, configuration information for the dual inline memory module, wherein the configuration information is utilized to set up the dual inline memory module after a loss of power, wherein the configuration information is stored in the second portion during a power-on self test of the information handling system, wherein the configuration information includes a reliability availability and serviceability mode for the dual inline memory module;
comparing a reliability availability and serviceability mode of the information handling system with the reliability availability and serviceability mode of the dual inline memory module after the dual inline memory module regains power; and
prompting a user to update the reliability availability and serviceability mode of the information handling system if the reliability availability and serviceability mode of the information handling system does not match the reliability availability and serviceability mode of the dual inline memory module.

2. The method of claim 1, further comprising:
retrieving the configuration information from the second portion of the non-volatile memory after the dual inline memory module regains power, wherein the configuration information includes a dual inline memory module slot identifier, a non-volatile dual inline memory module set sequence number, and a system model number for the dual inline memory module;
comparing a current dual inline memory module slot location in the information handling system with the dual inline memory module slot identifier of the dual inline memory module to validate that the dual inline memory module is populated in a correct dual inline memory module slot after the dual inline memory module regains power.

3. The method of claim 2, further comprising:
validating that each dual inline memory module identified in the a non-volatile dual inline memory module set sequence number are present in the information handling system after the dual inline memory module regains power; and
validating that the information handling system is a compatible system for the dual inline memory module based on the system model number after the dual inline memory module regains power.

4. The method of claim 1, further comprising:
providing the configuration information to the new information handling system via a system management bus prior to the dual inline memory module being powered on in a new information handling system, wherein the configuration information includes training values of communication speeds and timing for the dual inline memory module; and
determining timing and communication speeds between the new information handling system and the dual inline memory module based on utilizing the training values for the dual inline memory module as a starting point.

5. The method of claim 1, further comprising:
retrieving the configuration information from the second portion of the non-volatile memory after the dual inline memory module regains power.

6. The method of claim 1, further comprising:
providing the configuration information to the new information handling system via a system management bus prior to the dual inline memory module being powered on in a new information handling system, wherein the configuration information includes an encryption key for the data located in the first portion of the non-volatile memory of the dual inline memory module; and
accessing the data located in the first portion of the non-volatile memory via the encryption key after the dual inline memory module regains power.

7. A dual inline memory module comprising:
a local memory to store data during normal operation of the dual inline memory module; and
a non-volatile memory including a first portion configured to store the data located in the local memory in response to a power failure of an information handling system in communication with the dual inline memory module, and a second portion configured to store configuration information for the dual inline memory module, wherein the configuration information is utilized to set up the dual inline memory module in a new information handling, wherein the configuration information is stored in the second portion during a power-on self test of the information handling system, wherein the configuration information includes a reliability availability and serviceability mode for the dual inline memory module,
wherein a Basic Input/Output System of a new information handling system is configured to compare a reliability availability and serviceability mode of the new information handling system with the reliability availability and serviceability mode of the dual inline memory module after the dual inline memory module regains power, and to prompt a user to update the reliability availability and serviceability mode of the new information handling system if the reliability availability and serviceability mode of the new information handling system does not match the reliability availability and serviceability mode of the dual inline memory module.

8. The dual inline memory module of claim 7, further comprising:
a control module configured to communicate with the local memory and the flash memory, the control module configured to copy the data located in the local memory to the flash memory in response to the power failure.

9. The dual inline memory module of claim 8, wherein the control module is configured to communicate with the new information handling system via a system management bus to provide the new information handling system with the configuration information prior to the dual inline memory module being powered on in the new information handling system.

10. The dual inline memory module of claim 9, wherein the configuration information includes a dual inline memory module slot identifier, a non-volatile dual inline memory module set sequence number, and a system model number for the dual inline memory module, and the Basic Input/

Output System of the new information handling system is configured to compare a current dual inline memory module slot location in the new information handling system with the dual inline memory module slot identifier of the dual inline memory module to validate that the dual inline memory module is populated in a correct dual inline memory module slot of the new information handling system after the dual inline memory module regains power.

11. The dual inline memory module of claim 10, wherein the Basic Input/Output System is further configured to validate that each dual inline memory module identified in the a non-volatile dual inline memory module set sequence number are present in the information handling system after the dual inline memory module regains power, and to validate that the information handling system is a compatible system for the dual inline memory module based on the system model number after the dual inline memory module regains power.

12. The dual inline memory module of claim 9, wherein the configuration information includes training values of communication speeds and timing for the dual inline memory module, and a Basic Input/Output System of the new information handling system is configured to determine timing and communication speeds between the new information handling system and the dual inline memory module based on utilizing the training values for the dual inline memory module as a starting point.

13. The dual inline memory module of claim 9, wherein the configuration information includes an encryption key for the data located in the first portion of the non-volatile memory of the dual inline memory module, and a Basic Input/Output System of the new information handling system is configured to access the data located in the first portion of the non-volatile memory via the encryption key after the dual inline memory module regains power.

14. A method comprising:
   detecting a connection of a dual inline memory module to an information handling system;
   requesting configuration information for the dual inline memory module via a system management bus;
   receiving the configuration information from a control module of the dual inline memory module, wherein the control module retrieves the configuration information from a first portion of a non-volatile memory of the dual inline memory module, wherein the configuration information is stored in the first portion during a power-on self test of the information handling system, wherein the configuration information includes a reliability availability and serviceability mode for the dual inline memory module, and the reliability availability and serviceability mode is selected from a group consisting of error correction code (ECC) mode, sparing mode, lockstep mode, and mirror mode;
   comparing a reliability availability and serviceability mode of the information handling system with the reliability availability and serviceability mode of the dual inline memory module after the dual inline memory module regains power;
   prompting a user to update the reliability availability and serviceability mode of the information handling system if the reliability availability and serviceability mode of the information handling system does not match the reliability availability and serviceability mode of the dual inline memory module;
   updating the reliability availability and serviceability mode of the information handling system in response to a selection by the user to update the reliability availability and serviceability mode of the information handling system; and
   configuring communication between the information handling system and the dual inline memory module over a double data rate channel based on the configuration information.

15. The method of claim 14, further comprising:
   retrieving the configuration information from the first portion of the non-volatile memory after the dual inline memory module regains power, wherein the configuration information includes a dual inline memory module slot identifier, a non-volatile dual inline memory module set sequence number, and a system model number for the dual inline memory module;
   comparing a current dual inline memory module slot location in the information handling system with the dual inline memory module slot identifier of the dual inline memory module to validate that the dual inline memory module is populated in a correct dual inline memory module slot after the dual inline memory module regains power.

16. The method of claim 15, further comprising:
   validating that each dual inline memory module identified in the a non-volatile dual inline memory module set sequence number are present in the information handling system after the dual inline memory module regains power; and
   validating that the information handling system is a compatible system for the dual inline memory module based on the system model number after the dual inline memory module regains power.

17. The method of claim 14, further comprising:
   providing the configuration information to the new information handling system via a system management bus prior to the dual inline memory module being powered on in a new information handling system, wherein the configuration information includes training values of communication speeds and timing for the dual inline memory module; and
   determining timing and communication speeds between the new information handling system and the dual inline memory module based on utilizing the training values for the dual inline memory module as a starting point.

18. The method of claim 14, further comprising:
   retrieving the configuration information from the first portion of the non-volatile memory after the dual inline memory module regains power.

19. The method of claim 14, further comprising:
   providing the configuration information to the new information handling system via a system management bus prior to the dual inline memory module being powered on in a new information handling system, wherein the configuration information includes an encryption key for the data located in the first portion of the non-volatile memory of the dual inline memory module; and
   accessing the data located in the first portion of the non-volatile memory via the encryption key after the dual inline memory module regains power.

* * * * *